(12) United States Patent
Hendriks et al.

(10) Patent No.: US 11,111,632 B2
(45) Date of Patent: Sep. 7, 2021

(54) ARAMID PAPER SUITABLE FOR USE IN ELECTRONIC APPLICATIONS

(71) Applicant: TEIJIN ARAMID B.V., Arnhem (NL)

(72) Inventors: Antonius Hendriks, Arnhem (NL); Mónica López-Lorenzo, Arnhem (NL); Jan-Cees Tiecken, Didam (NL); Frank Diedering, Deventer (NL)

(73) Assignee: TEIJIN ARAMID B.V., Arnhem (NL)

( * ) Notice: Subject to any disclaimer, the term of this patent is extended or adjusted under 35 U.S.C. 154(b) by 87 days.

(21) Appl. No.: 16/464,534

(22) PCT Filed: Nov. 27, 2017

(86) PCT No.: PCT/EP2017/080508
§ 371 (c)(1),
(2) Date: May 28, 2019

(87) PCT Pub. No.: WO2018/099855
PCT Pub. Date: Jun. 7, 2018

(65) Prior Publication Data
US 2019/0376237 A1 Dec. 12, 2019

(30) Foreign Application Priority Data
Nov. 30, 2016 (EP) ..................................... 16201412

(51) Int. Cl.
*D21H 13/26* (2006.01)
*B32B 15/12* (2006.01)
(Continued)

(52) U.S. Cl.
CPC ............. *D21H 13/26* (2013.01); *B32B 15/12* (2013.01); *D21H 17/48* (2013.01); *H01L 31/02* (2013.01);
(Continued)

(58) Field of Classification Search
None
See application file for complete search history.

(56) References Cited

U.S. PATENT DOCUMENTS

| 5,910,231 A | 6/1999 | Kirayoglu et al. |
| 2010/0206502 A1 | 8/2010 | Levit |

(Continued)

FOREIGN PATENT DOCUMENTS

| CN | 102517976 A | * | 6/2012 |
| EP | 0930393 A1 | | 7/1999 |
| EP | 1310593 A1 | | 5/2003 |

OTHER PUBLICATIONS

Zhaoming, Q. et al., Preparation method of pure p-aramid paper, Jun. 27, 2012, machine translation of CN 102517976A (Year: 2012).*

(Continued)

*Primary Examiner* — Chinessa T. Golden
(74) *Attorney, Agent, or Firm* — Oliff PLC

(57) ABSTRACT

An aramid paper suitable for use in electronic applications which has a density of 0.20-0.65 g/cm3 and a grammage of 30-280 g/m2, which paper comprises 10-40 wt. % of aramid shortcut with a linear density of 2.6 dtex or lower and a length of 0.5-25 mm and 10-90 wt. % of aramid fibrid, wherein the aramid shortcut comprises at least 70 wt. % para-aramid shortcut and the aramid fibrid including at least 70 wt. % para-aramid fibrid. It has been found that the use of a paper with the above properties in electronic applications ensures a low CTE in combination with good homogeneity and a good dimensional stability resulting from good resin adhesion and penetration. Use of the aramid paper in a composite sheet including at least one layer of aramid paper and a resin, or in a substrate board for electronic applications.

12 Claims, 3 Drawing Sheets

(51) Int. Cl.
*D21H 17/48* (2006.01)
*H01L 31/02* (2006.01)
*H05K 1/03* (2006.01)

(52) U.S. Cl.
CPC ........ *H05K 1/0366* (2013.01); *B32B 2457/08* (2013.01); *B32B 2457/12* (2013.01); *H05K 2201/0284* (2013.01)

(56) References Cited

U.S. PATENT DOCUMENTS

| 2013/0260123 | A1 | 10/2013 | Krahn et al. |
| 2014/0034256 | A1 | 2/2014 | Fujimori et al. |
| 2015/0318078 | A1* | 11/2015 | Rolink ..................... H01B 3/52 162/138 |

OTHER PUBLICATIONS

Feb. 12, 2018 International Search Report issued in International Patent Application No. PCT/EP2017/080508.
Feb. 12, 2018 Written Opinion of the Searching Authority issued in International Patent Application No. PCT/EP2017/080508.

\* cited by examiner

Microscopy images of paper 1 according to the invention

Microscopy images of comparative paper 2

Microscopy images of comparative paper 3

ARAMID PAPER SUITABLE FOR USE IN ELECTRONIC APPLICATIONS

The present invention pertains to an aramid paper suitable for use as substrate in electronic applications. The invention also pertains to a resin-impregnated aramid paper suitable for this application, and to the use of said paper.

In many electronic applications use is made of a base or substrate for physically supporting the electronic components present therein. Examples of such applications include printed circuit boards and solar cells. The substrate generally consist of a substrate sheet and a matrix resin. Substrate boards for use in electronic applications need to meet various requirements. In addition to good insulating properties, they need to have good dimensional stability over long periods of use. Further, a key feature of substrate boards for electronic applications is a low coefficient of thermal expansion (CTE). This is because the temperature of electrical appliances often increases during use, and decreases after use. Changes in temperature also occur during production of electronic appliances. If the coefficient of thermal expansion of the substrate board would be too high, the expansion and shrinking of the board during production or use may cause damage to the connections and electronic components on the board.

EP178943 mentions the possibility of using woven sheets of para-aramid yarn in printed circuit boards. Para-aramid yarns are known for their low CTE. However, EP178943 indicates that woven sheets based on para-aramid yarn tend to result in undesirable resin micro-cracks at the point where the yarns cross-over in the woven fabric. EP178943 proposes printed circuit boards based on high-density para-aramid papers and resin, preferably containing both para-aramid pulp and para-aramid floc, which are indicated to show a desirably low value for the CTE and freedom from microcracks.

It has been found, however, that there is still room for improvement in this field. More in particular, it has been found that improvements are required to ensure that the resin impregnation of the papers is sufficient, both as regards the amount of resin taken up by the paper and the penetration of the resin into the paper. This is important to maintain good bonding between the resin and the aramid paper during production and use. Further, the homogeneity of the paper is important. It will be clear than an inhomogeneous paper will lead to an end product with insufficient properties. In particular, especially where the papers are getting thinner, this may become challenging to obtain.

There is therefore need in the art for a paper suitable for use in substrate boards for electronic applications which in addition to the low CTE associated with aramid papers shows good homogeneity and resin impregnation properties.

It has been found that this problem can be solved by the provision of a substrate board for electronic applications which comprises an aramid paper which has a density of 0.20-0.65 g/cm3 and a grammage of 30-280 g/m2, which paper comprises 10-40 wt. % of aramid shortcut with a linear density of 2.6 dtex or lower and a length of 0.5-25 mm and 10-90 wt. % of aramid fibrid, wherein the aramid shortcut comprises at least 70 wt. % para-aramid shortcut and the aramid fibrid comprises at least 70 wt. % para-aramid fibrid.

It has been found that the use of a paper with the above properties in electronic applications ensures a low CTE in combination with good homogeneity and a good dimensional stability resulting from good resin adhesion and penetration. Further advantages of the present invention and specific embodiments thereof will become apparent from the further specification.

It is noted that US2014/0034256 and US2010/0206502 describe aramid-containing papers which comprise a conductive filler. The papers described in these references are conductive, and are thus not suitable for use as substrate in electronic applications, which should be non-conductive.

EP0930393 describes a heat-resistant fiber paper comprising shortcut and fibrid. The paper should comprise 40-97 wt. % fiber and 3-60 wt. % fibrid. The shortcut preferably is 70-95 wt. % para-aramid and 5-30 wt. % meta-aramid.

The present invention will be discussed in more detail below.

Figure 1:
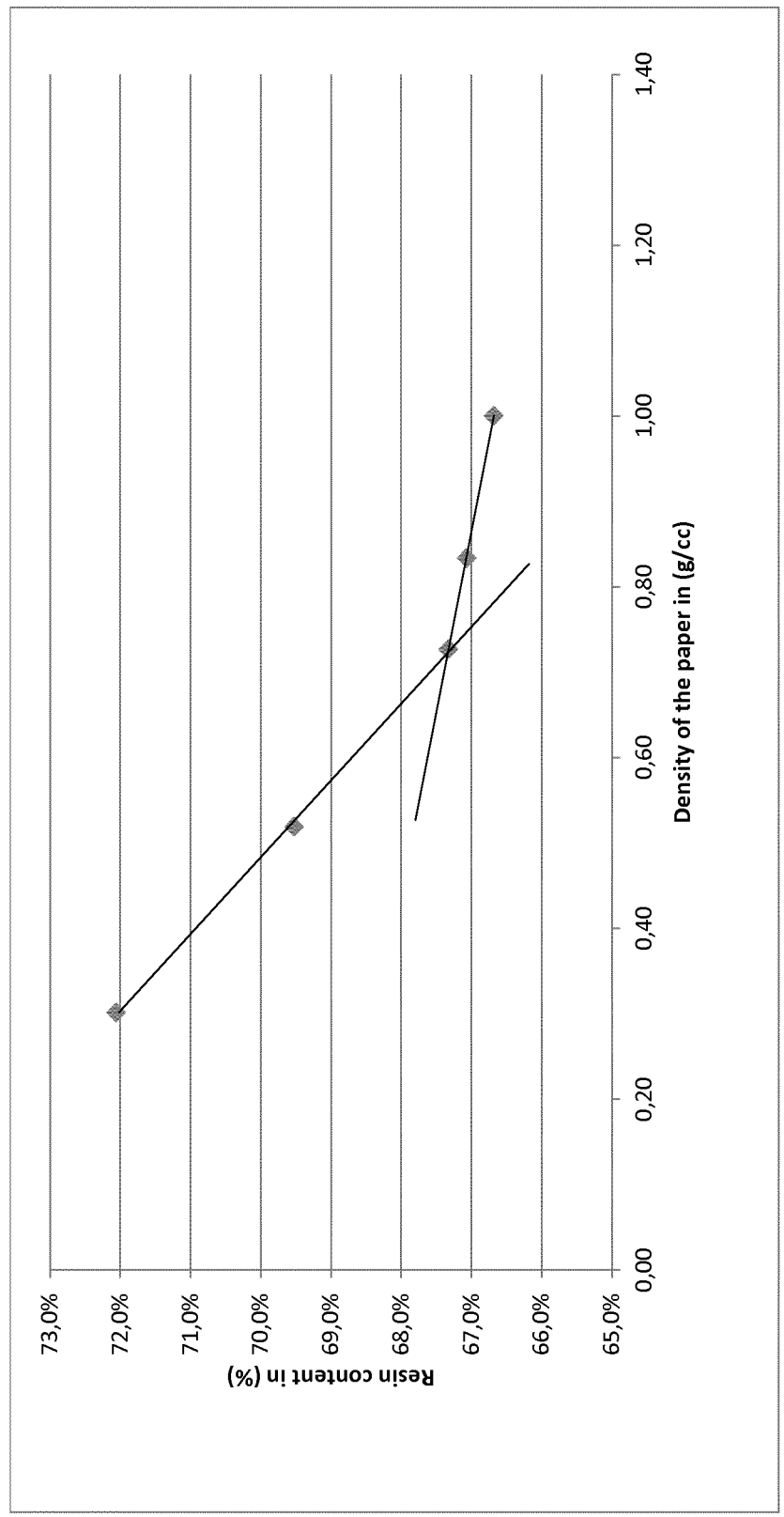
FIG. 1 shows a plot of the resin content of impregnated paper versus the density of the starting paper for papers according to the invention and for comparative papers.

The aramid paper of the present invention has a density of 0.20-0.65 g/cm3. It has been found that this relatively low density is important to obtain good resin impregnation properties, in particular a good resin uptake and resin penetration. It may be preferred for the density to be at least 0.30 g/cm3, in particular at least 0.40 g/cm3, and/or at most 0.60 g/cm3, in particular at most 0.55 g/cm3.

The aramid-based paper has a grammage of 30-280 g/m2. The exact grammage will depend on the desired strength and thickness of the substrate board for electronic applications. A grammage of at least 35 g/m2 may be preferred. Depending on the use, a grammage of at most 100 g/m2 may be preferred, in particular at most 65 g/m2.

In the context of the present specification aramid refers to an aromatic polyamide which is a condensation polymer of aromatic diamine and aromatic dicarboxylic acid halide. Aramids may exist in the meta- and para-form. In the present invention, the aramid shortcut comprises at least 70 wt. % para-aramid shortcut and the aramid fibrid comprises at least 70 wt. % para-aramid fibrid. Examples of para-aramids are poly(paraphenylene terephthalamide), poly(4,4'-benzanilide terephthalamide), poly(paraphenylene-4,4'-biphenylenedicarboxylic acid amide) and poly (paraphenylene-2,6-naphthalenedicarboxylic acid amide or copoly(para-phenylene/3,4'-dioxydiphenylene terephthalamide).

As para-aramid has improved heat resistance, thermal stability, and a lower low coefficient of thermal expansion (CTE) as compared to meta-aramid, it is preferred for the aramid shortcut to comprise at least 85 wt. % of para-aramid shortcut, in particular at least 95 wt. %, more in particular at least 98 wt. %. For the same reason, it is preferred for the aramid fibrid to comprise at least 85 wt. % of para-aramid fibrid, in particular at least 95 wt. %, more in particular at least 98 wt. %.

The use of poly(paraphenylene terephthalamide), also indicated as PPTA is particularly preferred. This applies to all aramid components present in the paper according to the invention.

The aramid paper of the present invention generally comprises at least 80 wt. % of aramid, more in particular at least 90 wt. %, still more in particular at least 95 wt. %, even more in particular at least 98 wt. %. It is particularly preferred for the aramid paper according to the invention to consist essentially of aramid, wherein the term "consists essentially of" means that the only components other than para-aramid are those the presence of which cannot be reasonably avoided. Weight percentages are calculated on dry paper.

To be suitable for use as substrate in electronic applications, the paper will not contain conductive filler. This means that the paper contains less than 1 wt. %, in particular less than 0.5 wt. % of conductive material. It is further preferred for the aramid paper of the present invention to have a surface resistivity of at least $1.10^6$ Ohm/square, in particular at least $1.10^8$ Ohm/square, more in particular at least $1.10^{10}$ Ohm/square. The maximum value is not critical, and may be infinite. A value of $1.10^{20}$ Ohm/square may be mentioned as a practical upper limit.

It is preferred for the aramid in the aramid paper of the present invention to comprise at least 85 wt. % of para-aramid, in particular at least 95 wt. %, more in particular at least 98 wt. %, the para-aramid preferably being poly(paraphenylene terephthalamide). This applies to the total of all aramid components present in the paper according to the invention.

The aramid-based paper comprises 10-40 wt. % of aramid shortcut with a linear density of 2.6 dtex or lower and a length of 0.5-25 mm.

As the name implies aramid shortcut is obtained by cutting aramid fibers to the desired length. When the shortcut is cut too short, the paper may have insufficient strength. When the shortcut is too long, it may be more difficult to process. In one embodiment, aramid shortcut is used with a length of 0.5-15 mm, in particular a length of 2 to 10 mm, more in particular 3-8 mm.

The linear density of the shortcut is 2.6 dtex or lower. Lower linear densities are considered preferred, because they result in a paper with an improved homogeneity. In one embodiment, the shortcut has a linear density of less than 2.0 dtex, in particular less than 1.7 dtex, more in particular less than 1.3 dtex, more preferred less than 1.2 dtex. In one embodiment, the linear density of the shortcut is 1.0 dtex or less. The linear density of the shortcut generally is at least 0.3 dtex, in particular at least 0.4 dtex, in some embodiments at least 0.5 dtex.

The amount of shortcut is between 10 and 40 wt. %. If less than 10 wt. % of shortcut is used, the strength of the paper will be insufficient. If more than 40 wt. % of shortcut is used, the homogeneity of the paper will be detrimentally affected. It may be preferred for the amount of shortcut to be at most 38 wt. %, in particular at most 35 wt. %, to ensure a homogeneous paper with good insulating properties.

The aramid-based paper comprises 10-90 wt. % of aramid fibrid. As indicated above, the aramid fibrid comprises at least 70 wt. % of para-aramid fibrid and it is preferred for the aramid fibrid to comprise at least 85 wt. % of para-aramid fibrid, in particular at least 95 wt. %, more in particular at least 98 wt. %.

Aramid fibrids are known in the art. Within the context of the present specification the term aramid fibrid refers to small, non-granular, non-rigid film-like particles. The film-like fibrid particles have two of their three dimensions in the order of microns, and have one dimension less than 1 micron. In one embodiment, the fibrids used in the present invention have an average length in the range of 0.2-2 mm, and average width in the range of 10-500 microns, and an average thickness in the range of 0.001-1 microns.

In one embodiment, the aramid fibrid comprises less than 40%, preferably less than 30%, of fines, wherein fines are defined as particles having a length weighted length (LL) of less than 250 micron.

Meta-aramid fibrids may be prepared by shear precipitation of polymer solutions into coagulating liquids as is well known from U.S. Pat. No. 2,999,788. Fibrids of wholly aromatic polyamides (aramids) are also known from U.S. Pat. No. 3,756,908, which discloses a process for preparing poly(meta-phenylene isophthalamide) (MPD-I) fibrids. Para-aramid fibrids are made via much later developed high shear processes such as for example described in WO2005/059247, which fibrids are also called jet-spun fibrids.

It is preferred to use para-aramid fibrid with a Schopper-Riegler (SR) value between 50 and 90, preferably between 70 and 90, more preferably between 75 and 85. These fibrids preferably have a specific surface area (SSA) of less than 10 m2/g, more preferably between 0.5 and 10 m2/g, most preferably between 1 and 4 m2/g.

In one embodiment, fibrids are used with a LL0.25 of at least 0.3 mm, in particular of at least 0.5 mm, more in particular at least 0.7 mm. In one embodiment the LL0.25 is at most 2 mm, more in particular at most 1.5 mm, still more in particular at most 1.2 mm. LL0.25 stands for the length weighted length of the fibrid particles wherein particles with a length below 0.25 mm are not taken into account.

It has been found that a paper with preferred properties is obtained if the amount of aramid fibrid is at least 20 wt. %, in particular at least 30 wt. %, or even at least 40 wt. %.

In one embodiment the aramid-based paper comprises aramid pulp. As for the other components of the paper, the aramid pulp comprises at least 70 wt. % of para-aramid pulp. It is preferred for the aramid pulp to comprise at least 85 wt. % of para-aramid pulp, in particular at least 95 wt. %, more in particular at least 98 wt. %.

Aramid pulp is well known in the art. Aramid pulp may be derived from aramid fibres which are cut to a length of, e.g., 0.5-6 mm, and then subjected to a fibrillation step, wherein the fibers are pulled apart to form the fibrils, whether or not attached to a thicker stem. Pulp of this type may be characterized by a length of, e.g., 0.5-6 mm, and a Schopper-Riegler of 15-85. In some embodiments, the pulp may have a surface area of 4-20 m2/g.

Within the context of the present specification, the term pulp also encompasses fibrils, i.e., "pulp" which predominantly contains the fibrillated part and little or no fiber stems. This pulp, which is sometimes also indicated as aramid fibril, can, e.g., be obtained by direct spinning from solution, e.g. as described in WO2004/099476. In one embodiment the pulp has a structural irregularity expressed as the difference in CSF (Canadian Standard Freeness) of never dried pulp and dried pulp of at least 100, preferably of at least 150. In one embodiment fibrils are used having in the wet phase a Canadian Standard Freeness (CSF) value less than 300 ml and after drying a specific surface area (SSA) less than 7 m2/g, and preferably a weight weighted length for particles having a length >250 micron (WL 0.25) of less than 1.2 mm, more preferably less than 1.0 mm. Suitable fibrils and their preparation method are described, e.g., in WO2005/059211.

Whether pulp is present, and if so, in wat amounts, will depend on the further composition of the paper. This will be discussed in more detail below.

In one embodiment, the paper of the present invention comprises 10-40 wt. % of aramid shortcut as discussed above, in particular 10-38 wt. %, more in particular 10-35 wt. %, in combination with 90-60 wt. % of aramid fibrid as discussed above.

In another embodiment, the paper of the present invention comprises 10-40 wt. % of aramid shortcut as discussed above in particular 10-38 wt. %, more in particular 10-35 wt. %, in combination with 10-80 wt. % aramid fibrid as discussed above and 10-80 wt. % of aramid pulp as discussed above. In this embodiment it may be preferred for the paper to comprise 10-40 wt. % of aramid shortcut as discussed above in combination with 20-80 wt. % aramid fibrid as discussed above and 10-40 wt. % of aramid pulp as discussed above.

In one embodiment, the paper according to the invention has a thickness in the range of 20 micron to 1 mm, in particular in the range of 30 micron to 500 micron, more in particular in the range of 50 to 200 micron.

The paper of in the present invention can be manufactured by methods known in the art. In one embodiment, a suspension, generally an aqueous suspension, is prepared comprising aramid fibrid, and shortcut as described above, and optionally pulp as described above. The suspension is applied onto a porous screen, so as to lay down a web of randomly interwoven material onto the screen. Water is removed from the web, e.g., by pressing and/or applying vacuum, followed by drying to make paper. If so desired, the dried paper is subjected to a calendering step. Calendering steps are known in the art. They generally involve passing the paper through a set of rolls, optionally at elevated temperatures. It may be beneficial for homogeneity of the paper to subject the fibrid to shear forces, such as in a Waring blender, prior to using it in the papermaking process.

The invention also pertains to a composite sheet comprising at least one layer of aramid paper as described above impregnated with a resin. The composite sheet can be used in electronic applications, such as a substrate board for solar cells, or a printed circuit board. One of the advantages of the present invention is that the CTE of the composite sheet can be adapted to the CTE of the component with which it is to be combined, in combination with the type and amount of resin.

For example, if the composite sheet is used in printed circuit boards, it will generally be provided with a copper layer. The CTE of the composite sheet can then be adjusted to match that of the copper layer, e.g., in the range of 5-15 ppm/° C.

If the composite sheet is to be used in solar cells, the CTE of the composite sheet can be adjusted to match that of the solar cell. In that case, where the solar cell is based on crystalline silicon, the CTE of the composite sheet preferably is in the range of 0-6 ppm/° C., in particular in the range of 1-5 ppm/° C., more in particular in the range of 2-4 ppm/° C.

The CTE of the paper according to the invention generally is in the range of −5 to +2 ppm/° C., in particular in the range of −5 to 0 ppm/° C., more in particular in the range of −5 to −2 ppm/° C. These latter ranges can be obtained when higher percentages of para-aramid are applied, as discussed above.

The CTE of the composite sheet is determined by the CTE of the paper and by the amount and type of resin incorporated therein. It is within the scope of the skilled person to select a suitable type and amount of resin, based on his common general knowledge.

Suitable resins are known in the art. Examples include epoxyresins, polyimide resins, phenolic resins, polyureas, polyurethanes, melamine formaldehyde resins, polyester resins, alkyd resins, and fluorocarbon resins such as polytetrafluoroethylene resins. Mixtures of resins are also often used, including mixtures of the resins mentioned above with thermoplastic resins, such as synthetic thermoplastic rubbers. Fluorocarbon resins may be preferred in view of their low dielectric constant, low dielectric loss, and low moisture uptake.

Depending on the application, the amount of resin may vary within wide ranges, e.g., in the range of 20-80 wt. %. For composite sheets to be used in substrate boards for solar cells, the amount may be in the range of 20-50 wt. %, preferably in the range of 25-45 wt. %. For composite sheets to be used in printed circuit boards, a higher amount of resin may be desirable, to achieve a higher CTE value. In this case, the amount of resin may preferably be in the range of 40-75 wt. %.

The composite sheet can be manufactured by methods known in the art, e.g., encompassing impregnating the paper with a resin as described above in the liquid phase, e.g., in the form of a melt, a solution, or a dispersion, and allowing the resin to solidify.

The step of allowing the resin to solidify can encompass, depending on the type and formulation of the resin one or more of solvent removal and curing. The curing step can be carried out through heat curing, but also through other curing mechanisms. This is part of the common general knowledge in this field, and requires no further elucidation here.

In accordance with a further embodiment of the invention, there is provided with a printed circuit board. The printed circuit board is prepared by coating copper on the composite sheet to produce a copper clad laminate, and further processing the copper clad laminate to produce the printed circuit board.

The invention thus also pertains to a laminate comprising a composite sheet comprising at least one layer of aramid paper as described above impregnated with a resin, wherein a copper layer is present on at least one side of the composite sheet. The copper layer may cover the entire surface of the composite sheet, but generally covers only part of the surface of the composite sheet. The copper layer may be in the form of a pattern. Applying the copper layer onto the composite sheet is part of the common general knowledge of the skilled person, and requires no further elucidation here.

The invention also pertains to a printed circuit board comprising a laminate as described above, wherein electrical components are affixed to the copper layer. The application of electrical components to a copper layered laminate is part of the common general knowledge of the skilled person and requires no further elucidation here.

In accordance with a further embodiment of the invention, there is provided a solar cell provided with a composite sheet according to the invention as backing. Solar cells are known in the art, and require no further elucidation here.

The invention also pertains to the use of an aramid paper as described herein in a composite sheet comprising at least one layer of aramid paper and a resin, or in a substrate board for electronic applications, e.g., in a printed circuit board, or in a backing for a solar cell.

It will be clear to the skilled person that various preferred embodiments described herein can be combined, unless thy are mutually exclusive.

The invention is illustrated by the following examples, without being limited thereto or thereby.

EXAMPLE 1: INFLUENCE OF DENSITY ON RESIN UPTAKE

Papers were prepared with the following composition: 50 wt. % para-aramid fibrids, 20 wt. % para-aramid pulp, and 30 wt. % para-aramid shortcut with a fiber length of 6 mm and a linear density of 1.7 dtex. All papers had a grammage of 55-56 g/m2.

The starting paper had a density of about 0.3 g/cc. Papers with higher density were obtained by calendering the papers. The resin impregnation properties of the papers was investigated as follows: For each paper, three strips were prepared of 15*200 mm. The weight of each strip was determined. A resin bath was prepared of a phenol-resol resin dissolved in isopropanol (Bakelite® PF1143 V) at room temperature. The resin had a viscosity of 70±20 mPa·s. Each strip was dipped into the resin bath for 30 seconds and hung up vertically, to allow excess resin to run off freely. When the dripping of resin stopped, the strip was hung in an over at 60° C. for 45 minutes to evaporate the solvent from the resin. Then the oven temperature was raised to 175° C., and the strips were left in the oven for 60 minutes to cure the resin. The weight of the resin-impregnated strips was determined, and the resin uptake was calculated. Results are presented in Table 1.

TABLE 1

| Paper [—] | Density [g/cc] | Grams of resin per m² of paper [g] | Resin content [%] |
|---|---|---|---|
| A (invention) | 0.30 | 143.8 | 72.1% |
| B (invention) | 0.52 | 125.7 | 69.5% |
| C (comparative) | 0.73 | 113.9 | 67.3% |
| D (comparative) | 0.83 | 113.4 | 67.1% |
| E (comparative) | 1.00 | 110.7 | 66.7% |

As can be seen from Table 1, an increase in density leads to a decrease in resin content.

FIG. 1 shows a plot of the resin content of the impregnated paper versus the density of the starting paper. From FIG. 1 there appears to be an inflection point at a density of 0.7 g/cc. Below that value, and thus in the range according to the invention, a relatively larger amount of resin can be impregnated into the paper than above that density.

EXAMPLE 2: INFLUENCE OF DENSITY ON RESIN PENETRATION

Figure 2:
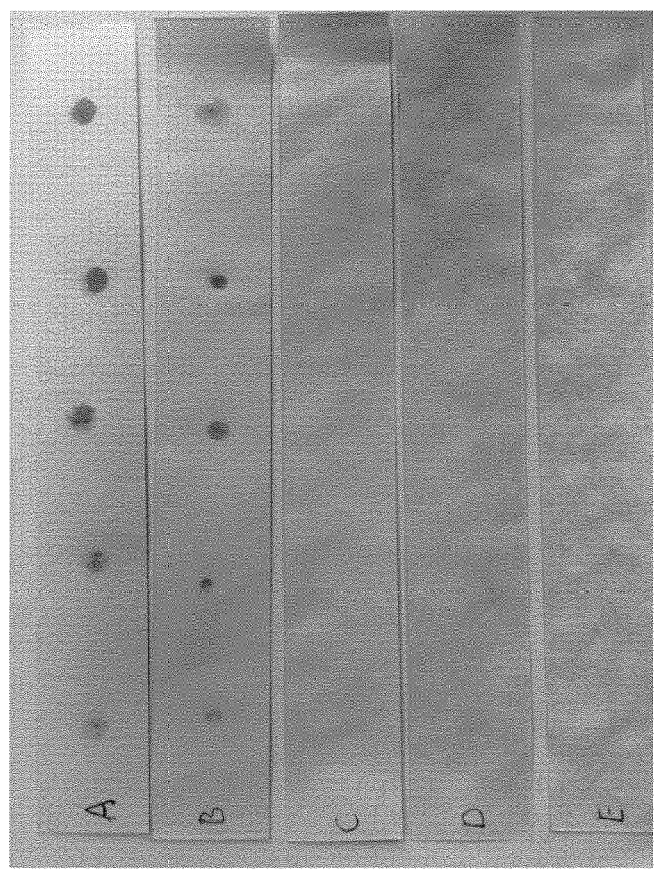
FIG. 2 shows, for papers according to the invention and for comparative papers, photographs of resin drops on the front side and the reverse side of the papers, to investigate resin penetration.
Figure 2:
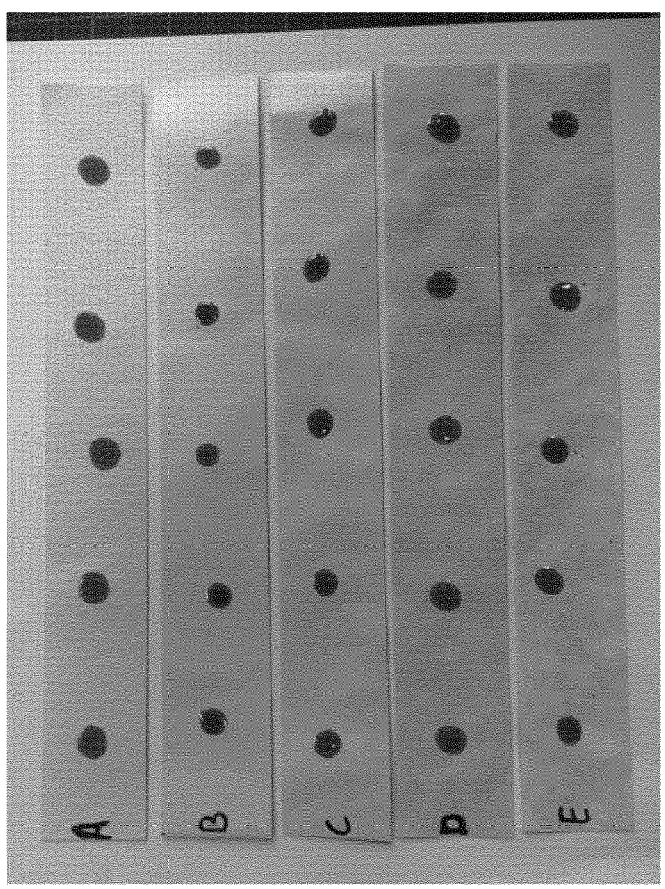

Strips of the papers of Example 1 were provided with drops of liquid resin using a pipette. Five drops of resin were applied per paper strip. The resin was a phenol-resol resin dissolved in isopropanol (Bakelite® PF1143 V) and used at room temperature. The papers were left for 24 hours and the resin penetration was investigated by determining the amount of resin found on the reverse side of the paper. Photographs of the results are in FIG. 2. The results are summarized in Table 2.

TABLE 2

| Paper | Density [g/cc] | Resin penetration to the reverse-side of the paper |
|---|---|---|
| A (invention) | 0.30 | clear penetration |
| B (invention) | 0.52 | clear penetration |
| C (comparative) | 0.73 | no visible penetration |
| D (comparative) | 0.83 | no visible penetration |
| E (comparative) | 1.00 | no visible penetration |

From these results it can be seen that papers with a density of above the claimed range do not show penetration of the resin through the paper. Apparently, resin is not impregnated into the paper. In contrast, the papers according to the invention do show penetration of the resin through the paper, and thus impregnation of the resin into the paper. These results are in line with those of Example 1. Papers with a density above the claimed value pick up less resin upon impregnation, and the resin impregnates less deeply into the paper. This is a measure for the bonding between the resin and the aramid sheet. If this bonding is insufficient, the bond between the aramid sheet and the resin may disintegrate over time, e.g., due to the heating and cooling cycles which electronic appliances such as printed circuit boards and solar cell panels encounter during use of the apparatus.

EXAMPLE 3: INFLUENCE OF COMPOSITION ON PAPER HOMOGENEITY

To investigate the influence of the composition of the paper, papers were prepared with the compositions presented in Table 3.

TABLE 3

| Paper | para-aramid fibrid [%] | para-aramid pulp [%] | para-aramid shortcut [%] |
|---|---|---|---|
| 1 (invention) | 50 | 20 | 30 |
| 2 (comparative) | 30 | 20 | 50 |
| 3 (comparative) | 50 | 0 | 50 |

Figure 3:
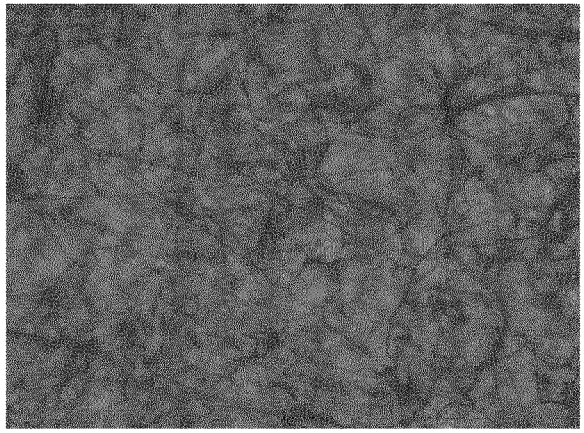
FIG. 3 shows optical microscope photographs papers according to the invention and comparative papers to investigate paper homogeneity.
Figure 3:
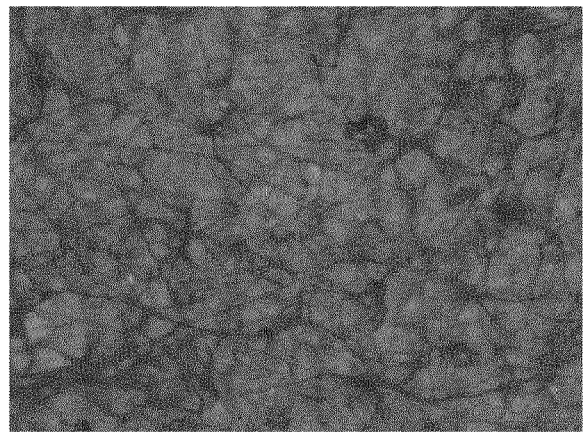
Figure 3:
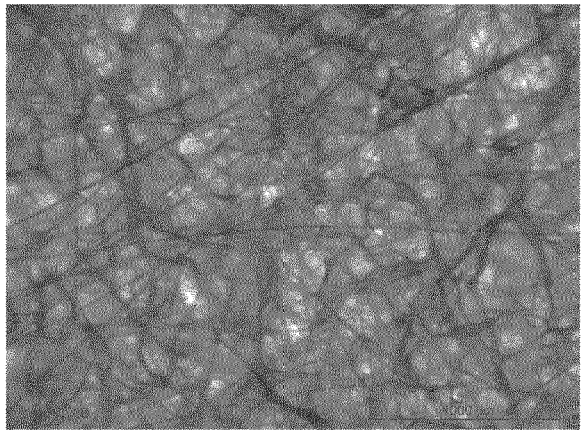
Figure 3:
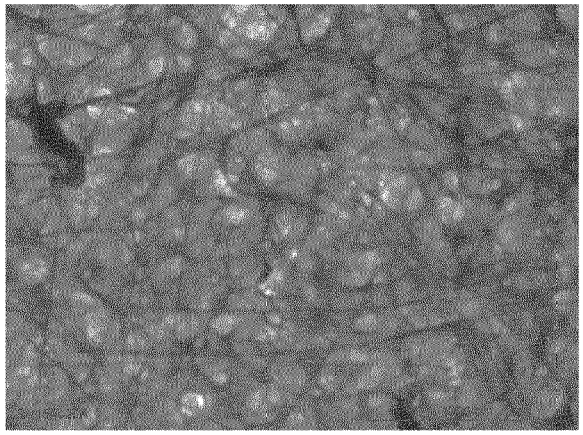
Figure 3:
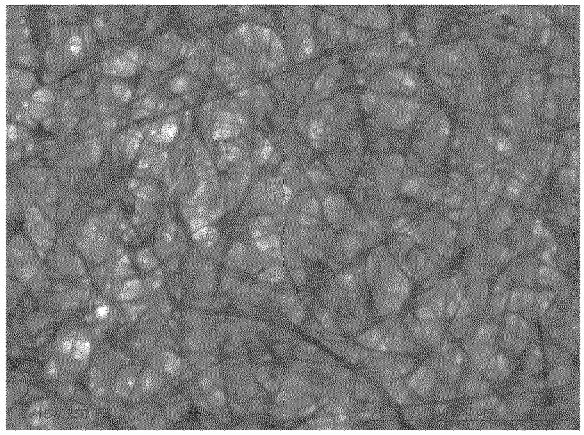
Figure 3:
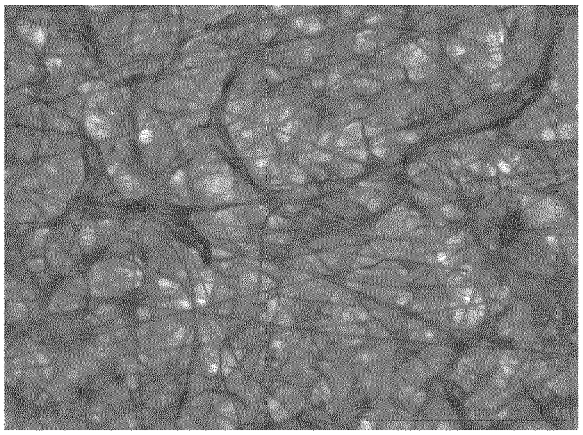

All papers had a grammage of 40 g/m2 and a density of about 0.25 g/cm3. The para-aramid shortcut had a length of 6 mm and a linear density of 1.7 dtex. Paper 1 is according to the invention. Papers 2 and 3 are both comparative because their shortcut content is too high. The properties of the papers were investigated visually using an optical microscope at 25× magnification, using the same settings for all samples (transmitted light, with the same intensity) in order to judge the homogeneity. For each paper two photographs are presented in FIG. 3. From FIG. 3 it can be seen that the comparative papers 2 and 3 show more "light spots" than paper 1 according to the invention. Light spots are locations where the paper is less dense than the surrounding paper. Their presence thus shows that the paper is not homogeneous. These irregularities in density will lead to irregularities in resin impregnation which will detrimentally affect the properties of the paper in use. They may even lead to pinholes affecting the insulating properties of the substrate board in electronic appliances.

EXAMPLE 4: INFLUENCE OF COMPOSITION ON PAPER AIR PERMEABILITY

The air permeability of the papers described in Example 3 was determined using an air permeability measuring device L&W 166 (Lorentzen & Wettre), in accordance with ISO 5636/3. The resulting value is the Gurley, which is the time required (in seconds) for a certain volume of air to pass through the paper at a certain pressure. The lower the Gurley, the higher the permeability of the paper. The results are presented in Table 4.

TABLE 4

| Paper | para-aramid fibrid [%] | para-aramid pulp [%] | para-aramid shortcut [%] | Gurley [seconds] |
|---|---|---|---|---|
| 1 (invention) | 50 | 20 | 30 | 10.4 |
| 2 (comparative) | 30 | 20 | 50 | 2.1 |
| 3 (comparative) | 50 | 0 | 50 | 3.6 |

From Table 4 it can be seen that paper 1 according to the invention has a much higher Gurley than the comparative papers. As all papers have the same areal weight, this means that the comparative papers have a higher permeability for air. This implies that there are more thin areas or pinholes where the air can pass through the paper. Thin areas and pinholes detrimentally affect the homogeneity of the resin impregnation and the properties of the final product.

The invention claimed is:

1. Aramid paper
wherein the aramid paper is suitable for use as substrate in electronic applications,
wherein the aramid paper has a density in the range of 0.20-0.65 g/cm$^3$ and a grammage in the range of 30-280 g/m$^2$,
wherein the aramid paper comprises
10-40 wt. % of aramid shortcut with a linear density of 2.6 dtex or lower and a length of 0.5-25 mm, wherein the aramid shortcut comprises at least 70 wt. % para-aramid shortcut,
10-80 wt. % of aramid fibrid, wherein the aramid fibrid comprises at least 70 wt. % para-aramid fibrid, and
10-80 wt. % of aramid pulp, and
wherein the aramid paper has a surface resistivity of at least 1×10$^6$ Ohms/square.

2. Aramid paper according to claim 1, wherein the aramid paper has a density in the range of 0.30-0.65 g/cm$^3$.

3. Aramid paper according to claim 1, wherein the aramid paper comprises at least 80 wt. % of aramid.

4. Aramid paper according to claim 1, wherein the aramid fibrid, the aramid shortcut and the aramid pulp each comprise at least 85 wt. % of para-aramid.

5. Aramid paper according to claim 1, wherein the aramid paper comprises at least 20 wt. % of aramid fibrid and at most 80 wt. % of aramid fibrid.

6. Aramid paper according to claim 1, wherein the aramid paper comprises 10-40 wt. % of aramid shortcut in combination with 80-60 wt. % of aramid fibrid.

7. Aramid paper according to claim 1, wherein the aramid paper comprises 10-40 wt. % of aramid shortcut in combination with 20-80 wt. % aramid fibrid and 10-40 wt. % of aramid pulp.

8. Aramid paper according to claim 1, wherein the aramid pulp is para-aramid pulp.

9. Composite sheet comprising at least one layer of the aramid paper according to claim 1 impregnated with a resin.

10. Laminate comprising a composite sheet according to claim 9 wherein a copper layer is present on at least one side of the composite sheet.

11. Printed circuit board comprising a laminate according to claim 10, wherein electrical components are affixed to the copper layer.

12. Solar cell provided with a composite sheet according to claim 9 as backing.

* * * * *